(12) United States Patent
Shimamoto et al.

(10) Patent No.: US 9,796,920 B2
(45) Date of Patent: Oct. 24, 2017

(54) QUANTUM DOT COMPOSITE AND WAVELENGTH CONVERSION ELEMENT, PHOTOELECTRIC CONVERSION DEVICE, AND SOLAR CELL HAVING THE COMPOSITE

(71) Applicant: DAICEL CORPORATION, Osaka-shi, Osaka (JP)

(72) Inventors: Shu Shimamoto, Tokyo (JP); Toshikazu Nakamura, Himeji (JP)

(73) Assignee: DAICEL CORPORATION, Osaka-shi (JP)

( * ) Notice: Subject to any disclaimer, the term of this patent is extended or adjusted under 35 U.S.C. 154(b) by 0 days.

(21) Appl. No.: 15/115,043

(22) PCT Filed: Jan. 29, 2014

(86) PCT No.: PCT/JP2014/000445
§ 371 (c)(1),
(2) Date: Jul. 28, 2016

(87) PCT Pub. No.: WO2015/114679
PCT Pub. Date: Aug. 6, 2015

(65) Prior Publication Data
US 2016/0347996 A1 Dec. 1, 2016

(51) Int. Cl.
| | |
|---|---|
| *H01B 1/20* | (2006.01) |
| *H01B 1/22* | (2006.01) |
| *H01L 31/00* | (2006.01) |
| *H01L 33/50* | (2010.01) |
| *C09K 11/02* | (2006.01) |
| *H01L 31/0352* | (2006.01) |
| *H01L 31/0384* | (2006.01) |
| *C09K 11/56* | (2006.01) |
| *C09K 11/88* | (2006.01) |
| *H01L 31/0749* | (2012.01) |
| *B82Y 20/00* | (2011.01) |
| *B82Y 30/00* | (2011.01) |

(52) U.S. Cl.
CPC .......... *C09K 11/025* (2013.01); *C09K 11/565* (2013.01); *C09K 11/883* (2013.01); *H01B 1/22* (2013.01); *H01L 31/0384* (2013.01); *H01L 31/035218* (2013.01); *H01L 31/0749* (2013.01); *B82Y 20/00* (2013.01); *B82Y 30/00* (2013.01); *H01L 33/502* (2013.01); *Y10S 977/774* (2013.01); *Y10S 977/948* (2013.01); *Y10S 977/95* (2013.01)

(58) Field of Classification Search
CPC ..... C09K 11/00; C09K 11/0805; B82Y 20/00; B82Y 30/00; H01L 31/035209; H01L 31/035218; H01B 1/20; H01B 1/22
See application file for complete search history.

(56) References Cited

U.S. PATENT DOCUMENTS

| | | | |
|---|---|---|---|
| 6,379,622 B1 | 4/2002 | Polak et al. | |
| 7,820,009 B2 * | 10/2010 | Gray | ......................... C08L 1/10 162/140 |
| 2007/0246734 A1 | 10/2007 | Lee et al. | |
| 2009/0212695 A1 | 8/2009 | Kim et al. | |
| 2012/0172585 A1 * | 7/2012 | Shimamoto | ............... C08B 3/06 536/69 |

FOREIGN PATENT DOCUMENTS

| | | |
|---|---|---|
| JP | 2007-281484 A | 10/2007 |
| JP | 2009-200041 A | 9/2009 |
| WO | WO 2008/013069 A1 | 1/2008 |
| WO | WO 2012/132239 A1 | 10/2012 |

OTHER PUBLICATIONS

Electrospinning of Fluorescent Fibers from CdSe/ZnS Quantum Dots in Cellulose Triacetate, Abitbol et al., Journal of Applied Polymer Science, vol. 119, 803-810 (2011).*
Abitbol et al., "CdSe/ZnS QDs Embedded in Cellulose Triacetate Films with Hydrophilic Surfaces", Chem. Mater. 2007, 19, 4270-4276.
Clément, L., and Rivière, C., Bull. SOC. chim., (5) 1, 1075 (1934).
International Search Report, issued in PCT/JP2014/000445, PCT/ISA/210, dated May 13, 2014.
Luque et al., "Increasing the Efficiency of Ideal Solar Cells by Photon Induced Transitions at Intermediate Levels", Physical Review Letters, vol. 78, No. 26, Jun. 30, 1997.
Rosenthal et al., "Fractionation of Cellulose Acetate", Industrial and Engineering Chemistry, Nov. 1952, 44 (11), 2693-2696.
Sookne et al., "Fractionation of Cellulose Acetate", Part of Journal of Research of the National Bureau of Standards, vol. 29, Aug. 1942, 123-130.
Extended European Search Report for Application No. 14880676.3, dated Jan. 18, 2017.

* cited by examiner

*Primary Examiner* — Khanh Tuan Nguyen
*Assistant Examiner* — Haidung Nguyen
(74) *Attorney, Agent, or Firm* — Birch, Stewart, Kolasch & Birch, LLP

(57) ABSTRACT

Disclosed herein is a quantum dot composite that can maintain luminous efficiency per unit quantum dot even when a quantum dot concentration is high, and therefore can achieve a high emission intensity. The quantum dot composite includes: a matrix; and quantum dots dispersed in the matrix, wherein the matrix is composed of cellulose acetate having a compositional distribution index (CDI) of 3.0 or less, and a concentration of the quantum dots is 0.05 wt % or higher.

14 Claims, No Drawings

QUANTUM DOT COMPOSITE AND WAVELENGTH CONVERSION ELEMENT, PHOTOELECTRIC CONVERSION DEVICE, AND SOLAR CELL HAVING THE COMPOSITE

TECHNICAL FIELD

The present invention relates to a quantum dot composite in which quantum dots are dispersed in a matrix, and more particularly relates to a quantum dot composite applicable to solar cells (photoelectric conversion devices), light-emitting devices such as LEDs, light-receiving sensors operating in the infrared region etc., wavelength conversion elements, and light-light conversion devices.

BACKGROUND ART

A PIN junction solar cell, in which a P-type semiconductor, an I-type semiconductor, and an N-type semiconductor are joined together, absorbs solar light having energy equal to or higher than the bandgap (Eg) between the conduction band and the valence band of the constituent semiconductors so that electrons are excited from the valence band to the conduction band, and holes are generated in the valence band, and therefore electromotive force is generated in the solar cell.

A PN junction solar cell and a PIN junction solar cell have a single bandgap and are therefore called single-junction solar cells. The PN-junction solar cell and the PIN junction solar cell transmit light having energy lower than the bandgap without absorbing it. On the other hand, energy higher than the bandgap is absorbed, but the absorbed energy higher than the bandgap is consumed as phonons, that is, as thermal energy. Therefore, the single junction solar cells having a single bandgap have a problem that the efficiency of energy conversion is poor.

In order to improve such a problem of energy conversion efficiency, Non-Patent Literature 1 proposes a quantum dot solar cell that utilizes quantum dots having a bandgap of 0.7 to 1.4 eV and quantum dots having a bandgap of 1.4 to 2.1 eV. In the quantum dot solar cell, the quantum dots are regularly arranged to form an intermediate band due to the overlap between the wave functions of the quantum dots, which makes it possible to absorb broadband solar energy.

Further, Non-Patent Literature 2 proposes a novel optical device using a polymer matrix containing semiconductor nanoparticles. This film exhibits the optical quantum size effect of the semiconductor nanoparticles. The quantum dot (QD)/polymer composite film proposed in this literature is prepared by solvent casting of a nanoparticle suspension obtained by suspending a CdSe/ZnS semiconductor in a cellulose triacetate (CTA) solution. Further, Non-Patent Literature 2 states that direct addition of QD to a common CTA casting solution has become possible.

CITATION LIST

Non-Patent Literatures

Non-Patent Literature 1: PHYSICAL REVIEW LETTERS, 78, 5014 (1997)
Non-Patent Literature 2: Chem. Mater. 2007, 19, 4270-4276

SUMMARY OF INVENTION

Technical Problem

When used for devices as in the case of Non-Patent Literature 2, quantum dots are often required to be used as a self-supporting material prepared by, for example, dispersion in a polymer matrix. However, when the concentration of quantum dots is increased in the preparation of such a quantum dot (QD)/polymer composite, aggregation of the quantum dots occurs so that luminous efficiency per unit quantum dot (quantum yield) is generally significantly reduced. Therefore, in Non-Patent Literature 2, the concentration of quantum dots is as low as 0.02 wt %.

Such a conventional technique has a problem that when the concentration of quantum dots is increased, luminous efficiency per unit quantum dot is reduced due to the aggregation of the quantum dots, that is, a problem that the concentration of quantum dots cannot be increased from the viewpoint of maintaining luminous efficiency.

Solution to Problem

In order to solve the above problem, the present inventors have intensively studied, and as a result have found that when a matrix is composed of cellulose acetate having a predetermined compositional distribution index (CDI), the concentration of quantum dots can be increased while luminous efficiency is maintained. This finding has led to the completion of the present invention.

More specifically, the present invention provides a quantum dot composite comprising: a matrix; and quantum dots dispersed in the matrix, wherein the matrix is composed of cellulose acetate having a compositional distribution index (CDI) of 3.0 or less, and a concentration of the quantum dots is 0.05 wt % or higher.

In the present invention, the concentration of the quantum dots is preferably 10 wt % or higher.

In the present invention, the cellulose acetate is preferably cellulose acetate whose compositional distribution index (CDI) represented by the following formula is 2.0 or lower.

In the present invention, the quantum dots are preferably CdSe/ZnS quantum dots.

Further, the present invention provides also a wavelength conversion element, a photoelectric conversion device, and a solar cell comprising the quantum dot composite.

Advantageous Effects of Invention

According to the present invention, it is possible to provide a quantum dot composite that can maintain luminous efficiency per unit quantum dot (hereinafter, sometimes referred to as quantum yield) even when the concentration of quantum dots is high, and therefore can achieve a high emission intensity.

DESCRIPTION OF EMBODIMENTS

Hereinbelow, one of preferred embodiments of the present invention will be specifically described.

[Matrix]

A matrix of a quantum dot composite according to the present invention is preferably a polymer material whose energy of interaction with quantum dots is low. A specific example of the matrix is cellulose acetate whose electron acceptability is high and energy of interaction with quantum dots is low.

The compositional fluctuation of cellulose acetate used as the matrix of the quantum dot composite according to the present invention is preferably small. Here, the compositional fluctuation is represented as a compositional distribution index (CDI). The total degree of acetyl substitution and the weight-average degree of polymerization (DPw) necessary to derive the compositional distribution index (CDI) will be described in order.

(Total Degree of Acetyl Substitution)

The total degree of acetyl substitution can be measured by a known titration method in which cellulose acetate is dissolved in water to determine the degree of substitution of the cellulose acetate. Alternatively, the total degree of acetyl substitution may be measured by converting cellulose acetate (sample) into completely-derivatized cellulose acetate propionate (CAP) in the same manner as when the measured value of half-width of compositional distribution that will be described later is determined and subjecting a solution obtained by dissolving the completely-derivatized cellulose acetate propionate in deuterated chloroform to NMR.

Alternatively, the total degree of acetyl substitution may be determined by determining an acetyl value according to a method for measuring an acetyl value specified in ASTM: D-817-91 (Standard Test Methods of Testing Cellulose Acetates) and converting the acetyl value into the total degree of acetyl substitution using the following formula. This is the most common method for determining the degree of substitution of cellulose acetate.

$$DS=162.14\times AV\times 0.01/(60.052-42.037\times AV\times 0.01)$$

DS: Total degree of acetyl substitution
AV: Acetyl value (%)

First, 500 mg of dried cellulose acetate (sample) is precisely weighed and dissolved in 50 mL of a mixed solvent of ultrapure water and acetone (volume ratio 4:1), and then 50 mL of a 0.2 N aqueous sodium hydroxide solution is added thereto for saponification at 25° C. for 2 hours. Then, 50 mL of 0.2 N hydrochloric acid is added, and the amount of released acetic acid is determined by titration with a 0.2 N aqueous sodium hydroxide solution (0.2 N sodium hydroxide normal solution) using phenolphthalein as an indicator. Further, a blank test (test without any sample) is also performed in the same manner. Then, AV (acetyl value) (%) is calculated according to the following formula:

$$AV\ (\%)=(A-B)\times F\times 1.201/\text{sample weight}(g),$$

wherein
A: titer (mL) of 0.2 N sodium hydroxide normal solution,
B: titer (mL) of 0.2 N sodium hydroxide normal solution in blank test, and
F: factor of 0.2 N sodium hydroxide normal solution.

The total degree of acetyl substitution of cellulose acetate used as the matrix of the quantum dot composite according to the present invention can be appropriately selected according to solubility in a solvent used to prepare the composite. For example, when acetone is used as a solvent, the total degree of acetyl substitution is preferably 2.1 to 2.5, more preferably 2.4 to 2.5. When N-methylpyrrolidone is used as a solvent, the total degree of acetyl substitution is preferably 0.5 to 2.9, more preferably 0.6 to 2.9.

The total degree of acetyl substitution of cellulose acetate used as the matrix of the quantum dot composite according to the present invention can be reduced by hydrolyzing the cellulose acetate in the presence of acetic acid, an excessive amount of water or alcohol relative to the amount of acetyl groups, and a catalyst (partial deacetylation reaction; ripening).

(Weight-Average Degree of Polymerization (DPw))

In the present invention, the weight-average degree of polymerization (DPw) is a value determined by GPC-light scattering using cellulose acetate propionate obtained by propionylating all the residual hydroxyl groups of cellulose acetate (sample).

The weight-average degree of polymerization (DPw) is determined by converting cellulose acetate (sample) into completely-derivatized cellulose acetate propionate (CAP) in the same manner as when the measured value of half-width of compositional distribution that will be described later is determined and analyzing the completely-derivatized cellulose acetate propionate by size exclusion chromatography (GPC-light scattering).

It is to be noted that light scattering detection is generally difficult to perform in an aqueous solvent. This is because an aqueous solvent generally contains a large amount of foreign matter and is likely to be secondarily contaminated even after once being purified. Further, there is a case where the expansion of molecular chains in an aqueous solvent is unstable due to the influence of ionic dissociable groups present in a trace amount. When a water-soluble inorganic salt (e.g., sodium chloride) is added to prevent this, there is a case where a dissolved state becomes unstable so that an assembly is formed in an aqueous solution. One of effective methods to avoid such a problem is that water-soluble cellulose acetate is derivatized so as to be soluble in an organic solvent that contains less foreign matter and is less likely to be secondarily contaminated in order to perform GPC-light scattering measurement in the organic solvent.

(Compositional Distribution Index (CDI))

The compositional distribution index (CDI) is defined as the ratio of the measured value to the theoretical value of half-width of compositional distribution [(measured value of half-width of compositional distribution)/(theoretical value of half-width of compositional distribution)]. The half-width of compositional distribution is also simply referred to as "half-width of substitution degree distribution".

The lower limit value of the compositional distribution index (CDI) is 0. This can be achieved by, for example, a special synthetic technique in which only the 6-position of a glucose residue is acetylated at a selectivity of 100% without acetylating the other positions. However, such a synthetic technique is unknown. When all the hydroxyl groups of glucose residues are acetylated and deacetylated with the same probability, CDI is 1.0.

The compositional distribution index (CDI) of cellulose acetate used as the matrix of the quantum dot composite according to the present invention can be determined by high-performance liquid chromatography (HPLC) analysis.

Before HPLC analysis is performed to determine the compositional distribution index, residual hydroxyl groups in the molecule of cellulose acetate are derivatized as pretreatment. The purpose of the pretreatment is to convert cellulose acetate with a low degree of substitution into a derivative that can be readily dissolved in an organic solvent so that HPLC analysis can be performed. More specifically, residual hydroxyl groups in the molecule are completely propionylated to obtain completely-derivatized cellulose acetate propionate (CAP), and the completely-derivatized cellulose acetate propionate (CAP) is analyzed by HPLC to determine the half-width of compositional distribution (measured value). Here, the derivatization should be completely performed so that the molecule contains no residual hydroxyl group and only acetyl groups and propionyl groups are present. That is, the sum of the total degree of acetyl substitution (DSac) and the total degree of propionyl substitution (DSpr) is 3. This is because a relational expression: DSac+DSpr=3 is used to create a calibration curve for converting the abscissa (elution time) of an HPLC elution curve of CAP into the degree of acetyl substitution (0 to 3).

The complete derivatization of cellulose acetate can be performed by allowing anhydrous propionic acid to act on the cellulose acetate in a mixed solvent of pyridine/N,N-dimethylacetamide using N,N-dimethylaminopyridine as a catalyst. More specifically, propionylation is performed at a temperature of 100° C. for a reaction time of 1.5 to 3.0 hours using a mixed solvent [pyridine/N,N-dimethylacetamide=1/1 (v/v)] as a solvent in an amount of 20 parts by weight relative to cellulose acetate (sample), anhydrous propionic acid as a propionylating agent in an amount of 6.0 to 7.5 equivalents relative to the hydroxyl groups of the cellulose acetate, and N,N-dimethylaminopyridine as a catalyst in an amount of 6.5 to 8.0 mol % relative to the hydroxyl groups of the cellulose acetate. Then, after the reaction, methanol is used as a precipitation solvent to obtain completely-derivatized cellulose acetate propionate as a precipitate. More specifically, for example, 1 part by weight of the reaction mixture is fed into 10 parts by weight of methanol at room temperature to form a precipitate, and the obtained precipitate is washed with methanol five times and vacuum-dried at 60° C. for 3 hours to obtain completely-derivatized cellulose acetate propionate (CAP).

The HPLC analysis is performed in the following manner. Two or more cellulose acetate propionate reference samples different in the total degree of acetyl substitution are analyzed by HPLC under predetermined measuring conditions using a predetermined measuring apparatus. Then, the analytical values of these reference samples are plotted to create a calibration curve [curve, generally, cubic curve showing the relationship between the elution time and the degree of acetyl substitution (0 to 3) of cellulose acetate propionate], and the compositional distribution index (CDI) of cellulose acetate used as the matrix of the quantum dot composite according to the present invention can be determined from the calibration curve.

More specifically, the compositional distribution index (CDI) can be determined by converting the abscissa (elution time) of an HPLC (reversed-phase HPLC) elution curve of cellulose acetate propionate measured under predetermined treatment conditions into the degree of acetyl substitution (0 to 3).

A method for converting the elution time into the degree of acetyl substitution may be a method described in, for example, JP 2003-201301 A (paragraphs [0037] to [0040]). For example, the conversion of the elution curve into a compositional distribution curve may be performed by using a conversion formula for determining the degree of acetyl substitution (DS) from the elution time (T). The conversion formula is obtained by measuring the elution times of two or more (e.g., four or more) samples different in the total degree of acetyl substitution under the same measuring conditions. More specifically, the function of the calibration curve [usually, the following quadratic] is determined by the method of least squares from the relationship between the elution time (T) and the degree of acetyl substitution (DS):

$$DS=aT^2+bT+c$$

(wherein DS represents the degree of acetyl substitution, T represents the elution time, and a, b, and c each represent the coefficient of the conversion equation).

Then, a substitution degree distribution curve [substitution degree distribution curve of cellulose acetate propionate with the abundance of cellulose acetate propionate on the ordinate and the degree of acetyl substitution on the abscissa] (also referred to as "intermolecular substitution degree distribution curve") is determined from the calibration curve. In the substitution degree distribution curve, the half-width of substitution degree distribution is determined for the maximum peak (E) corresponding to the average degree of substitution in the following manner. A base line (A-B) tangent to the low substitution degree-side base point (A) and the high substitution degree-side base point (B) of the peak (E) is drawn, and a line perpendicular to the base line is drawn from the maximum peak (E) to the abscissa to determine an intersection point (C) of the perpendicular line and the base line (A-B). A midpoint (D) between the maximum peak (E) and the intersection point (C) is determined. A straight line parallel to the base line (A-B) is drawn so as to pass through the midpoint (D) to determine two intersection points (A', B') of the straight line and the intermolecular substitution degree distribution curve. Perpendicular lines are draw from the two intersection points (A', B') to the abscissa, and a width between two intersection points of the perpendicular lines and the abscissa is defined as the half-width of the maximum peak (i.e., the half-width of substitution degree distribution). The half-width of substitution degree distribution can be determined by high-performance liquid chromatography (HPLC) analysis. It is to be noted that a method for converting the abscissa (elution time) of an HPLC elution curve of cellulose ester to the degree of substitution (0 to 3) is described in JP 2003-201301 A (paragraphs [0037] to [0040]).

Such a half-width of the compositional distribution curve reflects that the molecular chains of cellulose acetate propionate contained in a sample are different in retention time depending on the degree of acetylation of hydroxyl groups on the glucose rings of each of the constituent polymer chains. Therefore, the width of the retention time ideally indicates the width of compositional distribution (in terms of the degree of substitution). However, a high-performance liquid chromatograph includes a tube section that does not contribute to partition, such as a guide column for protecting a column). Therefore, the width of the retention time that is not attributable to the width of compositional distribution is often included as an error caused by the structure of the measuring apparatus. As described above, this error is influenced by the length and inner diameter of the column and the length and route from the column to a detector, and therefore varies depending on the structure of the apparatus.

For this reason, the half-width of the compositional distribution curve of cellulose acetate (measured value of half-width of compositional distribution) can be usually determined as a corrected value based on a correction formula represented by the following formula (1). The use of such a correction formula makes it possible to determine a more accurate measured value of the half-width of compositional distribution as a constant (almost constant) value irrespective of the type of measuring apparatus used (and irrespective of measuring conditions used).

$$Z=(X^2-Y^2)^{1/2} \quad (1),$$

wherein

X is an uncorrected half-width of a compositional distribution curve determined with a predetermined measuring apparatus under predetermined measuring conditions, and Y is an apparatus constant defined by the following formula:

$$Y=(a-b)\times/3+b(0\leq x\leq 3), \text{ wherein}$$

a: apparent half-width of compositional distribution of cellulose acetate having a total degree of substitution of 3 determined with the same measuring apparatus under the same measuring conditions as in the determination of the above X (actually, the cellulose acetate has a total degree of substitution of 3 and therefore does not have a substitution degree distribution), b: apparent half-width of compositional distribution of cellulose propionate having a total degree of substitution of 3 determined with the same measuring apparatus under the same measuring conditions as in the determination of the above X, and x: total degree of acetyl substitution of a measurement sample ($0 \leq x \leq 3$).

In the above formula, "cellulose acetate (or cellulose propionate) having a total degree of substitution of 3" refers to cellulose ester in which all the hydroxyl groups are esterified, and actually (or ideally) refers to cellulose acetate (or cellulose propionate) not having a half-width of compositional distribution (i.e., having a half-width of compositional distribution of 0).

The compositional distribution index (CDI) is determined from the Z (measured value of half-width of compositional distribution) based on the following formula (2):

$$CDI = Z/Z_0 \tag{2}$$

wherein $Z_0$ is a theoretical value of the half-width of compositional distribution of a compositional distribution curve generated when acetylation and partial deacetylation in the preparation of all the partially-substituted cellulose acetates occur with equal probability among all the hydroxyl groups (or acetyl groups) of all the molecules.

The $Z_0$ (theoretical value of half-width of compositional distribution) is a theoretical value that can be stochastically calculated by the following formula (3):

[Formula 1]

$$\text{Theoretical value of half-width of composition distribution} = 2.35482\sqrt{mpq}/DPw \tag{3}$$

wherein m: total number of hydroxyl groups and acetyl groups in one molecule of cellulose acetate, p: probability that hydroxyl groups in one molecule of cellulose acetate are acetyl-substituted, q=1−p, and DPw: weight-average degree of polymerization (value determined by GPC-light scattering using cellulose acetate propionate obtained by propionylating all the residual hydroxyl groups of cellulose acetate).

Further, the $Z_0$ (theoretical value of half-width of compositional distribution) can be represented by the following formula using the degree of substitution and the degree of polymerization. In the present invention, the following formula (4) is used as a definitional formula to determine the theoretical value of half-width of compositional distribution:

[Formula 2]

$$Z_0 = 2.35482\sqrt{3 \cdot DPw \cdot p \cdot q}/DPw \tag{4}$$

wherein

DPw: weight-average degree of polymerization (value determined by GPC-light scattering using cellulose acetate propionate obtained by propionylating all the residual hydroxyl groups of cellulose acetate), p: total degree of acetyl substitution of cellulose acetate/3, and q: 1−p Here, as described above, the weight-average degree of polymerization (DPw) of cellulose acetate can be determined by performing GPC-light scattering measurement after conversion into propionylated cellulose acetate.

More strictly, the formulas (3) and (4) should take the distribution of polymerization degree into consideration. In this case, "DPw" in the formulas (3) and (4) should be replaced with the function of distribution of polymerization degree, and the entire formulas should be integrated from a polymerization degree of 0 to infinity. However, the formulas (3) and (4) give a theoretical value with an approximately sufficient accuracy as long as DPw is used. If DPn (number-average degree of polymerization) is used, the influence of distribution of polymerization degree cannot be ignored, and therefore DPw should be used.

The Z of the compositional distribution curve (measured value of half-width of compositional distribution) of cellulose acetate used as the matrix of the quantum dot composite according to the present invention is preferably 0.12 to 0.34, more preferably 0.13 to 0.25.

The above-described theoretical formula of compositional distribution gives a value stochastically calculated on the assumption that acetylation and deacetylation all independently and evenly proceed, that is, a calculated value according to the binomial distribution. Such an ideal situation does not occur in reality. The compositional distribution of cellulose ester is much wider than that stochastically determined according to the binomial distribution unless a special measure is taken so that the hydrolysis reaction of cellulose acetate approaches an ideal random reaction and/or compositional fractionation occurs in post-treatment performed after the reaction.

One of possible special measures taken against the reaction is, for example, to maintain the system under such conditions that deacetylation and acetylation are in equilibrium. However, this case is not preferred because decomposition of cellulose proceeds by an acid catalyst. Another special measure taken against the reaction is to use such reaction conditions that the deacetylation rate of a low-substituted substance is reduced. However, a specific method to achieve this has not heretofore been known. That is, there is no known special measure taken against the reaction to stochastically control the substitution degree distribution (compositional distribution) of cellulose ester according to the binomial distribution. Further, various circumstances such as a non-uniform acetylation process (acetylation process of cellulose) and partial or temporal precipitation caused by water added stepwise in a ripening process (hydrolysis process of cellulose acetate) act to make the substitution degree distribution (compositional distribution) wider than the binomial distribution. It is actually impossible to avoid all of them to achieve ideal conditions. This is similar to the fact that an ideal gas is just an ideal product and an actual gas behaves somewhat differently from an ideal gas.

According to the present invention, as will be described later, the compositional distribution of cellulose acetate can be controlled by performing posttreatment under adjusted conditions after the hydrolysis process of cellulose acetate. According to literatures (CiBment, L., and Rivibre, C., Bull. SOC. chim., (5)1, 1075 (1934), Sookne, A. M., Rutherford, H. A., Mark, H., and Harris, M. J. Research Natl. Bur. Standards, 29, 123 (1942), A. J. Rosenthal, B. B. White Ind. Eng. Chem., 1952, 44 (11), pp. 2693 to 2696), molecular weight-dependent fractionation and minor fractionation associated with the degree of substitution (chemical composition) occur in the precipitation fractionation of cellulose acetate having a degree of substitution of 2.3, but there is no report that remarkable fractionation can be achieved based on the degree of substitution (chemical composition) as in the case of the present invention. It has not been verified that the substitution degree distribution (chemical composition) can be controlled by dissolution fractionation or precipitation fractionation as in the case of the present invention.

Another measure found by the present inventors to narrow the compositional distribution is to perform the hydrolysis reaction (ripening reaction) of cellulose acetate at a high temperature of 90° C. or higher (or higher than 90° C.). Irrespective of the fact that the degree of polymerization of a product obtained by a high-temperature reaction has not heretofore been analyzed or investigated in detail, it has been believed cellulose decomposition preferentially occurs in a high-temperature reaction at 90° C. or higher. This idea is considered as an assumption (stereotype) based on only the consideration of viscosity. The present inventors have found that when cellulose acetate with a low degree of substitution is obtained by performing the hydrolysis reaction of cellulose acetate in a large amount of acetic acid at a high temperature of 90° C. or higher (or higher than 90° C.) in the presence of a strong acid, preferably sulfuric acid, the degree of polymerization does not reduce, but viscosity reduces as CDI reduces. That is, the present inventors have revealed that the reduction in viscosity associated with the high-temperature reaction is not caused by a reduction in the degree of polymerization but is based on a reduction in structural viscosity caused by narrowing the substitution degree distribution (compositional distribution). When the hydrolysis of cellulose acetate is performed under the above conditions, not only a forward reaction but also a reverse reaction occurs, and therefore the CDI of a product (cellulose acetate with low degree of substitution) is very small and the solubility of the product in water is significantly improved. On the other hand, when the hydrolysis of cellulose acetate is performed under conditions where a reverse reaction is less likely to occur, the substitution degree distribution (compositional distribution) is widened due to various factors, and therefore the amounts of poorly water-soluble cellulose acetate having a total degree of acetyl substitution of less than 0.4 and cellulose acetate having a total degree of acetyl substitution of higher than 1.1 contained in a product are increased so that the solubility of the product in water is reduced as a whole.

A small compositional distribution index (CDI) of cellulose acetate used as the matrix of the quantum dot composite according to the present invention means that acetyl groups are relatively uniformly dispersed in the cellulose acetate.

The compositional distribution index (CDI) is preferably 3.0 or less, more preferably 2.0 or less because quantum dots in the matrix are less likely to aggregate and therefore their dispersibility can be improved.

The quantum dot composite according to the present invention comprises cellulose acetate having a compositional distribution index (CDI) of 3.0 or less, and therefore even when its quantum dot concentration (hereinafter, sometimes referred to as quantum dot fraction) is 0.05 wt % or higher, a reduction in quantum yield can be prevented. When the quantum dot concentration is higher, a difference in quantum yield between the quantum dot composite according to the present invention and a quantum dot composite comprising cellulose acetate having a compositional distribution index (CDI) of higher than 3.0 is more significant.

Therefore, the quantum dot fraction of the quantum dot composite according to the present invention is preferably 1 wt % or higher, more preferably 5 wt % or higher, even more preferably 10 wt % or higher, most preferably 20 wt % or higher.

In the case of a quantum dot composite comprising cellulose acetate having a compositional distribution index (CDI) of higher than 3.0 or another resin, a reduction in quantum yield is more significant when its quantum dot fraction is higher to be 10 wt % or higher, especially 20 wt % or higher. However, the quantum dot composite according to the present invention comprising cellulose acetate having a compositional distribution index (CDI) of 3.0 or less can maintain a high quantum yield.

Further, the quantum dot composite according to the present invention comprising cellulose acetate having a compositional distribution index (CDI) of 2.0 or less can maintain a very high quantum yield even when its quantum dot fraction is higher as compared to a quantum dot composite comprising cellulose acetate having a compositional distribution index (CDI) of higher than 2.0 or another resin.

According to the present invention, it is possible to obtain a quantum dot composite having a high relative emission intensity, because the quantum dot composite can maintain a high quantum yield even when its quantum dot concentration is high.

(Production of Cellulose Acetate)

Cellulose acetate used as the matrix of the quantum dot composite according to the present invention can be produced through, for example, a hydrolysis (ripening) step (A) of hydrolyzing cellulose acetate with a medium to high degree of substitution, a precipitation step (B), and a washing and neutralization step (C) that is performed, if necessary.

[(A) Hydrolysis Step (Ripening Step)]

In this step, cellulose acetate with a medium to high degree of substitution (hereinafter, sometimes referred to as "raw material cellulose acetate") is hydrolyzed. The total degree of acetyl substitution of cellulose acetate with a medium to high degree of substitution used as a raw material is, for example, 1.5 to 3, preferably 2 to 3. The raw material cellulose acetate may be commercially-available cellulose diacetate (total degree of acetyl substitution: 2.27 to 2.56) or cellulose triacetate (total degree of acetyl substitution: higher than 2.56 to 3).

The hydrolysis reaction can be performed by reacting the raw material cellulose acetate with water in an organic solvent in the presence of a catalyst (ripening catalyst). Examples of the organic solvent include acetic acid, acetone, alcohols (e.g., methanol), and a mixed solvent of two or more of them. Among them, a solvent containing at least acetic acid is preferred. The catalyst may be one that is commonly used as a deacetylation catalyst, and is particularly preferably sulfuric acid.

The amount of the organic solvent (e.g., acetic acid) to be used is, for example, 0.5 to 50 parts by weight, preferably 1 to 20 parts by weight, more preferably 3 to 10 parts by weight per 1 part by weight of the raw material cellulose acetate.

The amount of the catalyst (e.g., sulfuric acid) to be used is, for example, 0.005 to 1 part by weight, preferably 0.01 to 0.5 parts by weight, even more preferably 0.02 to 0.3 parts by weight per 1 part by weight of the raw material cellulose acetate. If the amount of the catalyst is too small, there is a case where the time of hydrolysis is too long so that the molecular weight of cellulose acetate is reduced. On the other hand, if the amount of the catalyst is too large, the degree of change in the rate of depolymerization depending on the temperature of hydrolysis is large, and therefore the rate of depolymerization is high even when the temperature of hydrolysis is relatively low, which makes it difficult to obtain cellulose acetate having a relatively large molecular weight.

The amount of water used in the hydrolysis step is, for example, 0.5 to 20 parts by weight, preferably 1 to 10 parts by weight, more preferably 2 to 7 parts by weight per 1 part by weight of the raw material cellulose acetate. Further, the amount of water is, for example, 0.1 to 5 parts by weight, preferably 0.3 to 2 parts by weight, more preferably 0.5 to 1.5 parts by weight per 1 part by weight of the organic solvent (e.g., acetic acid). The total amount of water to be used may be present in the system at the start of the reaction. However, in order to prevent the precipitation of cellulose acetate, part of water to be used may be present in the system at the start of the reaction, and then the remaining water may be added to the system once or in several batches.

The temperature of the reaction in the hydrolysis step is, for example, 40 to 130° C., preferably 50 to 120° C., more preferably 60 to 110° C. Particularly, when the temperature of the reaction is 90° C. or higher (or higher than 90° C.), the equilibrium of the reaction tends to shift toward the direction that the rate of a reverse reaction (acetylation reaction) relative to a forward reaction (hydrolysis reaction) increases. As a result, the substitution degree distribution (compositional distribution) becomes narrow so that cellulose acetate with a low degree of substitution having a very small compositional distribution index (CDI) can be obtained without particularly performing posttreatment under adjusted conditions. In this case, a strong acid such as sulfuric acid is preferably used as the catalyst, and an excessive amount of acetic acid is preferably used as the reaction solvent. Further, even when the temperature of the reaction is 90° C. or less, as will be described later, cellulose acetate with a low degree of substitution having a very small compositional distribution index (CDI) can be obtained by performing precipitation using a mixed solvent containing two or more solvents as a precipitation solvent or by performing precipitation fractionation and/or dissolution fractionation in the precipitation step.

[(B) Precipitation Step]

In this step, after the completion of the hydrolysis reaction, the temperature of the reaction system is reduced to room temperature, and a precipitation solvent is added to the reaction system to precipitate cellulose acetate with a low degree of substitution. The precipitation solvent may be an organic solvent miscible with water or an organic solvent having high solubility in water. Examples of the precipitation solvent include ketones such as acetone and methyl ethyl ketone; alcohols such as methanol, ethanol, and isopropyl alcohol; esters such as ethyl acetate; nitrogen-containing compounds such as acetonitrile; ethers such as tetrahydrofuran; and mixed solvents of two or more of them.

The use of a mixed solvent containing two or more solvents as the precipitation solvent produces the same effect as precipitation fractionation that will be described later, and therefore makes it possible to obtain cellulose acetate with a low degree of substitution having a narrow compositional distribution and a small compositional distribution index (CDI). Preferred examples of the mixed solvent include a mixed solvent of acetone and methanol and a mixed solvent of isopropyl alcohol and methanol.

The cellulose acetate with a low degree of substitution obtained by precipitation may further be subjected to precipitation fractionation (fractional precipitation) and/or dissolution fractionation (fractional dissolution). This makes it possible to obtain cellulose acetate with a low degree of substitution having a narrow compositional distribution and a very small compositional distribution index (CDI).

The precipitation fractionation can be performed, for example, in the following manner. The cellulose acetate with a low degree of substitution (solid) obtained by precipitation is dissolved in water to obtain an aqueous solution having an appropriate concentration (e.g., 2 to 10 wt %, preferably 3 to 8 wt %), a poor solvent is added to the aqueous solution (or the aqueous solution is added to a poor solvent) and the resulting mixture is maintained at an appropriate temperature (e.g., 30° C. or lower, preferably 20° C. or lower) to precipitate cellulose acetate with a low degree of substitution, and then the thus obtained precipitate is collected. Examples of the poor solvent include alcohols such as methanol and ketones such as acetone. The amount of the poor solvent to be used is, for example, 1 to 10 parts by weight, preferably 2 to 7 parts by weight per 1 part by weight of the aqueous solution.

The dissolution fractionation can be performed, for example, in the following manner. A mixed solvent of water and an organic solvent (e.g., a ketone such as acetone or an alcohol such as ethanol) is added to the cellulose acetate with a low degree of substitution (solid) obtained by precipitation or the cellulose acetate with a low degree of substitution (solid) obtained by precipitation fractionation, the resulting mixture is stirred at an appropriate temperature (e.g., 20 to 80° C., preferably 25 to 60° C.), and is then separated into a dense phase and a dilute phase by centrifugation, and a precipitation solvent (e.g., a ketone such as acetone or an alcohol such as methanol) is added to the dilute phase to collect a precipitate (solid). The mixed solvent of water and an organic solvent has an organic solvent concentration of, for example, 5 to 50 wt %, preferably 10 to 40 wt %.

[(C) Washing and Precipitation Step]

The precipitate (solid) obtained in the precipitation step (B) is preferably washed with an organic solvent (poor solvent) such as an alcohol (e.g., methanol) or a ketone (e.g., acetone). The precipitate is also preferably washed and neutralized with an organic solvent (e.g., an alcohol such a methanol or a ketone such as acetone) containing a basic substance.

Examples of the basic substance include: alkali metal compounds (e.g., alkali metal hydroxides such as sodium hydroxide and potassium hydroxide; alkali metal carbonates such as sodium carbonate and potassium carbonate; alkali metal hydrogen carbonates such as sodium hydrogen carbonate; alkali metal carboxylates such as sodium acetate and potassium acetate; and sodium alkoxides such as sodium methoxide and sodium ethoxide); alkaline-earth metal compounds (e.g., alkaline-earth metal hydroxides such as magnesium hydroxide and calcium hydroxide; alkaline-earth metal carbonates such as magnesium carbonate and calcium carbonate; alkaline-earth metal carboxylates such as magnesium acetate and calcium acetate; and alkaline-earth metal alkoxides such as magnesium ethoxide). Among them, alkali metal compounds such as potassium acetate are particularly preferred.

The washing and neutralization can efficiently remove impurities such as the catalyst (e.g., sulfuric acid) used in the hydrolysis step.

[Quantum Dots]

Quantum dots of the quantum dot composite according to the present invention are nano-sized particles each made of, for example, a wavelength conversion composition that wavelength-converts absorbed light in a specific wavelength region into light having energy lower than that of the absorbed light. The composition of the quantum dots is not particularly limited, but when the quantum dots are formed using, for example, an inorganic material, a semiconductor such as CdSe/ZnS, CdS, CdSe, or Cl(G)S is used. When the quantum dots are formed using, for example, an organic material, fullerene, an organic fluorescent dye, or an organic fluorescent dye molecule is used.

Among them, CdSe/ZnS is preferably used for its ready availability.

The quantum dots preferably have a particle diameter of 1.5 nm to 9 nm. If the particle diameter is less than 1.5 nm, their bandgap is too large, and therefore a desired wavelength conversion effect cannot be obtained. On the other hand, if the particle diameter exceeds 9 nm, the quantum dots exhibit the same properties as a so-called bulk semiconductor, and therefore a quantum size effect that the bandgap varies depending on the particle size cannot be expected.

The upper limit of the quantum dot fraction of the quantum dot composite according to the present invention is not particularly limited, but is preferably 40 wt % or less from the viewpoint of the dispersibility of the quantum dots.

[Quantum Dot Composite]

The quantum dot composite according to the present invention can be obtained by drying a quantum dot/cellulose acetate solution obtained by mixing a quantum dot dispersion and a cellulose acetate solution.

When the quantum dot composite according to the present invention is formed into a film, the quantum dot/cellulose acetate solution is vacuum-concentrated, casted on a substrate such as a glass plate with, for example, a bar coater, and dried to obtain a film.

When used for solar cells (photoelectric conversion devices), light-emitting devices such as LEDs, light-receiving sensors operating in the infrared region etc., wavelength conversion elements, and light-light conversion devices, the quantum dot composite according to the present invention is preferably formed into a film from the viewpoint of photoelectric conversion performance or wavelength conversion performance.

The drying may be performed by, for example, drying at room temperature for 24 hours and then at 80° C. for 24 hours and further vacuum-drying at 40° C. for 24 hours so that the resulting film can be separated from the substrate. If necessary, the separated film may further be dried. It is to be noted that a film (unstretched film) having a uniform surface can be obtained by performing leveling after the casting. This film may be stretched to obtain a stretched film. The stretching can be performed by a known method.

The above film may contain a plasticizer as long as the effect of the present invention is not impaired. The plasticizer is not particularly limited, and examples thereof include polycarboxylate-based plasticizers, glycolate-based plasticizers, phthalate-based plasticizers, fatty acid ester-based plasticizers, polyhydric alcohol ester-based plasticizers, polyester-based plasticizers, and acrylic plasticizers.

The thickness of the film-shaped quantum dot composite is not particularly limited as long as solar cells (photoelectric conversion devices), light-emitting devices such as LEDs, light-receiving sensors operating in the infrared region etc., wavelength conversion elements, and light-light conversion devices using the film-shaped quantum dot composite can provide their respective desired photoelectric conversion or wavelength conversion performance, but is preferably 0.01 to 0.3 mm (10 to 300 μm), more preferably 0.02 to 0.1 mm. If the thickness is larger than 0.3 mm, there is a case where total light transmittance is reduced, and therefore it is difficult to achieve excellent photoelectric conversion efficiency or wavelength conversion efficiency. On the other hand, if the thickness is less than 0.01 mm, there is a case where it is difficult to handle the material or the material is likely to have a defect.

(Quantum Yield)

The quantum yield of the quantum dot composite according to the present invention is emission intensity relative to the emission intensity of a fluorescent substance, Rhodamine 590, and specifically, can be determined, for example, in the following manner.

The absorbance at 485 nm of the quantum dot composite and the absorbance at 485 nm of a polymer film made of the matrix constituting the quantum dot composite are determined, and then the absorbance of the polymer film is subtracted from the absorbance of the quantum dot composite to calculate a corrected absorbance.

An ethanol solution of a fluorescent substance, Rhodamine 590 is prepared as a control, and the concentration of the ethanol solution and the thickness of a cell are adjusted to achieve the same absorbance as the corrected absorbance. The ratio (%) of the emission intensity of the quantum dot composite to the emission intensity of the control is determined as a quantum yield.

(Relative Emission Intensity)

The relative emission intensity of the quantum dot composite according to the present invention can be determined by the following formula (5).

$$\text{Relative emission intensity} = \text{quantum yield} \times \text{quantum dot fraction(wt \%)}/100 \quad (5)$$

EXAMPLES

Hereinbelow, the present invention will be specifically described with reference to examples. However, the technical scope of the present invention is not limited to these examples.

Example 1

(Cellulose Acetate)

First, 100 parts by weight of cellulose triacetate (manufactured by Sigma-Aldrich) (Sigma-Aldrich-CTA) was dispersed in 1000 parts by weight of acetone at room temperature (22° C.), and the resulting dispersion was centrifuged at 15° C. and 8,000 rpm for 30 minutes to obtain a gelled precipitate. Then, the gelled precipitate was dispersed in 2,000 parts by weight of methanol, and the resulting dispersion was centrifuged under the above-described conditions to obtain a precipitate. The washing with methanol was performed twice. The thus obtained precipitate was vacuum-dried at 40° C. until a constant weight was achieved. The thus obtained sample was dissolved in 2,500 parts by weight of methylene chloride/methanol (=9/1 (weight ratio)), and the resulting solution was dropped into 7,500 parts by weight of hexane to obtain a precipitate. The precipitate was vacuum-dried at 40° C. until a constant weight was achieved to obtain 80 parts by weight of purified cellulose diacetate (Sigma-Aldrich-CTA-fraction).

(Cellulose Acetate Solution)

The purified cellulose diacetate (Sigma-Aldrich-CTA-fraction) was dissolved in N-methylpyrrolidone (NMP) at a concentration of 1.18 mg/mL to prepare a cellulose acetate solution.

(Quantum Dots)

As quantum dots, a CdSe/ZnS quantum dot (diameter: 2.6 nm) dispersion (manufactured by Evident Technologies) was used. The CdSe/ZnS quantum dot dispersion has a concentration of 1.18 mg/mL and uses toluene as a solvent, and the emission wavelength of the quantum dots was 550 nm.

(Quantum Dot/Cellulose Acetate Solution)

As shown in Table 1, in order to prepare quantum dot composites different in quantum dot fraction (wt %), predetermined parts by volume of the CdSe/ZnS quantum dot (diameter: 2.6 mm) dispersion (manufactured by Evident Technologies) was added to 100 parts by volume of the cellulose acetate solution.

TABLE 1

| Quantum dot fraction (wt %) of quantum dot structure | Amount of quantum dot dispersion (parts by volume) |
|---|---|
| 1 | 1 |
| 5 | 5 |
| 10 | 10 |
| 20 | 20 |

(Quantum Dot Composite)

The quantum dot/polymer solution was vacuum-concentrated at 40° C. in a rotary evaporator to achieve a polymer concentration of 8%. This concentrated solution was casted on a glass plate with a Baker-type film applicator (wet film thickness: about 0.8 mm), dried at room temperature for 24 hours and then at 80° C. for 24 hours, and further vacuum-dried at 40° C. for 24 hours to obtain a film-shaped quantum dot composite having a thickness of 0.07 mm.

(Measurement of Total Degree of Acetyl Substitution)

Unsubstituted hydroxyl groups of the obtained purified cellulose diacetate (Sigma-Aldrich-CTA-fraction) as a cellulose acetate sample with a low degree of substitution were propionylated in accordance with the method of Tezuka (Carbohydr. Res. 273, 83 (1995)). The total degree of acetyl substitution of the propionylated cellulose acetate with a low degree of substitution was determined from the signals of acetyl carbonyl at 169 to 171 ppm and the signals of propionyl carbonyl at 172 to 174 ppm in 13C-NMR in accordance with the method of Tezuka (idem).

(Measurement of Weight-Average Degree of Polymerization (DPw))

The weight-average degree of polymerization (DPw) of the obtained purified cellulose diacetate (Sigma-Aldrich-CTA-fraction) was determined by GPC-light scattering measurement under the following conditions after conversion into propionylated cellulose acetate.

Apparatus: GPC "SYSTEM-21H" manufactured by Shodex

Solvent: acetone

Column: two GMHx1 columns (Tosoh) with a guard column (Tosoh)

Flow Rate: 0.8 mL/min

Temperature: 29° C.

Sample Concentration: 0.25% (wt/vol)

Injection Volume: 100 μL

Detection: MALLS (Multi-Angle Laser Light Scattering Detector) ("DAWN-EOS" manufactured by Wyatt)

Reference Material for MALLS correction: PMMA (molecular weight: 27600)

(Measurement of Compositional Distribution Index (CDI))

The compositional distribution index (CDI) of the obtained purified cellulose diacetate (Sigma-Aldrich-CTA-fraction) was determined by HPLC analysis under the following conditions after conversion into propionylated cellulose acetate.

Apparatus: Agilent 1100 Series

Column: Waters Nova-Pak phenyl 60 Å 4 μm (150 mm×3.9 mmϕ)+guard column

Column Temperature: 30° C.

Detection: Varian 380-LC

Injection Volume: 5.0 μL (Sample Concentration: 0.1% (wt/vol))

Eluant: Solution A: MeOH/H2O=8/1 (v/v), Solution B: CHCl3/MeOH=8/1 (v/v)

Gradient: A/B=80/20→0/100 (28 min); Flow Rate: 0.7 mL/min

First, preparations having a known total degree of acetyl substitution (DS) in the range of 0 to 3 were analyzed by HPLC to create a calibration curve of elution time vs. DS. Based on the calibration curve, an elution curve (time vs. detected intensity curve) of an unknown sample was converted into a DS vs. detected intensity curve (compositional distribution curve). An uncorrected half-width X of this compositional distribution curve was determined, and a corrected half-width Z of compositional distribution was determined by the following formula (1). The Z is a measured value of the half-width of compositional distribution.

$$Z = (X^2 - Y^2)^{1/2} \quad (1),$$

wherein

X is an uncorrected half-width of a compositional distribution curve determined with a predetermined measuring apparatus under predetermined measuring conditions, and Y is an apparatus constant defined by the following formula:

$$Y = (a-b)x/3 + b \,(0 \le x \le 3), \text{ wherein}$$

a: apparent half-width of compositional distribution of acetate cellulose having a total degree of substitution of 3 determined with the same measuring apparatus under the same measuring conditions as in the determination of the above X (actually, the cellulose acetate has a total degree of substitution of 3 and therefore does not have a substitution degree distribution), b: apparent half-width of compositional distribution of cellulose propionate having a total degree of substitution of 3 determined with the same measuring apparatus under the same measuring conditions as in the determination of the above X, and x: total degree of acetyl substitution of a measurement sample (0≤x≤3).

From the Z (measured value of half-width of compositional distribution), the compositional distribution index (CDI) is determined by the following formula (2):

$$CDI = Z/Z_0 \quad (2),$$

wherein $Z_0$ is a theoretical value of the half-width of compositional distribution of a compositional distribution curve generated when acetylation and partial deacetylation in the preparation of all the partially-substituted cellulose acetates occur with equal probability among all the hydroxyl groups (or acetyl groups) of all the molecules. The $Z_0$ is defined by the following formula (4):

[Formula 3]

$$Z_0 2.35482\sqrt{3 \cdot DPw \cdot p \cdot q}/DPw \quad (4),$$

wherein

DPw: weight-average degree of polymerization (value determined by GPC-light scattering using cellulose acetate propionate obtained by propionylating all the residual hydroxyl groups of the cellulose acetate), p: total degree of acetyl substitution/3, and q: 1−p.

(Measurement of Quantum Yield)

The absorbance at 485 nm of the obtained film-shaped quantum dot composite having a thickness of 0.07 mm and the absorbance at 485 nm of a polymer film made of the matrix (Sigma-Aldrich-CTA-fraction) constituting the quantum dot composite and having a thickness of 0.07 mm were determined using Cary 300 BIO photospectrometer (manufactured by Varian), and then the absorbance of the polymer film was subtracted from the absorbance of the quantum dot composite to calculate a corrected absorbance.

An ethanol solution of a fluorescent substance, Rhodamine 590 was prepared as a control, and the concentration of the ethanol solution and the thickness of a cell were adjusted to achieve the same absorbance as each of the quantum dot composites.

The obtained film-shaped quantum dot composite having a thickness of 0.07 mm and the control were subjected to the measurement of emission spectrum from 500 to 650 nm at an excitation wavelength of 485 nm using a fluorometer, FluoroMax-2 (manufactured by Jobin Yvon-Spex), and their respective emission intensities were integrated. The rate (%) of the integral of the quantum dots to the integral of the emission intensity of the control was defined as a quantum yield.

(Relative Emission Intensity)

Based on each of the quantum yields, a relative emission intensity was determined by the following formula (5).

Relative emission intensity=quantum yield×quantum dot fraction (vvt %)/100 (5)

The measurement results of the total degree of acetyl substitution (DS), the weight-average degree of polymerization (DPw), the compositional distribution index (CDI), the quantum yield, and the relative emission intensity are shown in Tables 2 and 3.

Example 2

(Cellulose Acetate)

Hardwood prehydrolyzed kraft pulp having an α-cellulose content of 98.4 wt % was crushed into cotton-like pulp with a disc refiner. Then, 26.8 parts by weight of acetic acid was sprayed onto 100 parts by weight of the crushed pulp (water content: 8%), and the resulting mixture was well stirred and was then allowed to stand for 60 hours for activation as pretreatment (activation step). The activated pulp was added to a mixture of 323 parts by weight of acetic acid, 245 parts by weight of acetic anhydride, and 13.1 parts by weight of sulfuric acid. The temperature of the resulting mixture was adjusted from 5° C. to the highest temperature of 40° C. over 40 minutes, and acetylation was performed for 90 minutes. A neutralizer (24% aqueous magnesium acetate solution) was added over 3 minutes so that the amount of sulfuric acid (amount of ripening sulfuric acid) was adjusted to 2.5 parts by weight. Further, the temperature of the reaction bath was increased to 75° C., and then water was added to adjust the concentration of water (ripening water) in the reaction bath to 56 mol %. It is to be noted that the concentration of ripening water was determined by multiplying the molar ratio of water to acetic acid in the reaction bath by 100 and was expressed as mol %. Then, ripening was performed at 75° C. for 210 minutes and then stopped by neutralizing sulfuric acid with magnesium acetate to obtain a reaction mixture containing cellulose diacetate. An aqueous dilute acetic acid solution was added to the obtained reaction mixture to separate the cellulose diacetate, and then the cellulose diacetate was washed with water, dried, and stabilized with calcium hydroxide to obtain cellulose diacetate (CDA).

Then, 100 parts by weight of the obtained cellulose diacetate (CDA) was dispersed in 1,000 parts by weight of methylene chloride at room temperature (about 22° C.), and the resulting dispersion was centrifuged at 15° C. and 8,000 rpm for 30 minutes to obtain a gelled precipitate. The gelled precipitate was dispersed in 2,000 parts by weight of methanol, and the resulting dispersion was centrifuged under the above-described conditions to obtain a precipitate. The washing with methanol was performed twice. Further, washing was performed twice using a 50 wt % aqueous acetone solution instead of methanol. Then, washing with 1,000 parts by weight of water was further performed twice. The washed precipitate was vacuum-dried at 40° C. until a constant weight was achieved to obtain 61 parts by weight of purified cellulose diacetate (CDA-fraction).

(Quantum Dot Composite)

Quantum dot composites were obtained in the same manner as in Example 1 except that the purified cellulose diacetate (Sigma-Aldrich-CTA-fraction) was changed to the purified cellulose diacetate (CDA-fraction). The measurement of total degree of acetyl substitution (DS), weight-average degree of polymerization (DPw), compositional distribution index (CDI), quantum yield, and relative emission intensity was performed in the same manner as in Example 1, and the measurement results are shown in Tables 2 and 3.

Example 3

(Cellulose Acetate)

First, 5.1 parts by weight of acetic acid and 2.0 parts by weight of water were added to 1 part by weight of cellulose acetate (manufactured by Daicel Corporation under the trade name of "L-50", total degree of acetyl substitution: 2.43, 6% viscosity: 110 mPa·s), and the resulting mixture was stirred at 40° C. for 5 hours to obtain a solution uniform in appearance. Then, 0.13 parts by weight of sulfuric acid was added to this solution, and the resulting solution was maintained at 70° C. to perform hydrolysis (partial deacetylation reaction; ripening). It is to be noted that in this ripening process, water was added to the system twice along the way. More specifically, 0.67 parts by weight of water was added after 1 hour from the start of the reaction, and then 1.67 parts by weight of water was further added after 2 hours from the first addition of water, and then the reaction was further performed for 7 hours. That is, the total time of hydrolysis was 10 hours. It is to be noted that the process from the start of the reaction to the first addition of water is referred to as first ripening, the process from the first addition of water to the second addition of water is referred to as second ripening, and the process from the second addition of water to the end of the reaction (completion of ripening) is referred to as third ripening.

After the completion of the hydrolysis, the temperature of the system was reduced to room temperature (about 25° C.) by cooling, and 15 parts by weight of a mixed solvent of acetone/methanol (=1/1 (weight ratio)) (precipitant) was added to the reaction mixture to form a precipitate.

The precipitate was collected as a wet cake having a solid content of 15 wt %, washed by adding 8 parts by weight of methanol thereto, and then deliquored to achieve a solid content of 15 wt %. This was repeated three times. The washed precipitate was further washed with 8 parts by weight of methanol containing 0.004 wt % of potassium acetate twice for neutralization and then dried to obtain cellulose acetate with a low degree of substitution (WSCA-70-0.8).

(Quantum Dot Composite)

Quantum dot composites were obtained in the same manner as in Example 1 except that the purified cellulose diacetate (Sigma-Aldrich-CTA-fraction) was changed to the cellulose acetate with a low degree of substitution (WSCA-70-0.8). The measurement of total degree of acetyl substitution (DS), weight-average degree of polymerization (DPw), compositional distribution index (CDI), quantum yield, and relative emission intensity was performed in the same manner as in Example 1, and the measurement results are shown in Tables 2 and 3.

Example 4

(Cellulose Acetate)

Cellulose triacetate (Cellulose Triacetate, 43% acetyl, manufactured by Sigma-Aldrich) was used. It is to be noted that this sample is referred to as Sigma-Aldrich-CTA.

(Quantum Dot Composite)

Quantum dot composites were obtained in the same manner as in Example 1 except that the purified cellulose diacetate (Sigma-Aldrich-CTA-fraction) was changed to the cellulose triacetate (Sigma-Aldrich-CTA). The measurement of total degree of acetyl substitution (DS), weight-average degree of polymerization (DPw), compositional distribution index (CDI), quantum yield, and relative emission intensity was performed in the same manner as in Example 1, and the measurement results are shown in Tables 2 and 3.

Example 5

(Cellulose Acetate)

Cellulose diacetate (CDA) was obtained in the same manner as in Example 2.

(Quantum Dot Composite)

Quantum dot composites were obtained in the same manner as in Example 1 except that the purified cellulose diacetate (Sigma-Aldrich-CTA-fraction) was changed to the cellulose diacetate (CDA). The measurement of total degree of acetyl substitution (DS), weight-average degree of polymerization (DPw), compositional distribution index (CDI), quantum yield, and relative emission intensity was performed in the same manner as in Example 1, and the measurement results are shown in Tables 2 and 3.

Example 6

(Cellulose Acetate)

Cellulose acetate with a low degree of substitution (WSCA-40-0.8) was obtained in the same manner as in Example 3 except that the reaction temperature was changed to 40° C., the time of first ripening, the time of second ripening, and the time of third ripening were changed to 8 hours, 16 hours, and 42 hours, respectively, and the precipitant was changed to methanol.

(Quantum Dot Composite)

Quantum dot composites were obtained in the same manner as in Example 1 except that the purified cellulose diacetate (Sigma-Aldrich-CTA-fraction) was changed to the cellulose acetate with a low degree of substitution (WSCA-40-0.8). The measurement of total degree of acetyl substitution (DS), weight-average degree of polymerization (DPw), compositional distribution index (CDI), quantum yield, and relative emission intensity was performed in the same manner as in Example 1, and the measurement results are shown in Tables 2 and 3.

Example 7

(Cellulose Acetate)

Cellulose acetate with a low degree of substitution (WSCA-40-0.9) was obtained in the same manner as in Example 3 except that the reaction temperature was changed to 40° C., the time of first ripening, the time of second ripening, and the time of third ripening were changed to 8 hours, 16 hours, and 36 hours, respectively, and the precipitant was changed to methanol.

(Quantum Dot Composite)

Quantum dot composites were obtained in the same manner as in Example 1 except that the purified cellulose diacetate (Sigma-Aldrich-CIA-fraction) was changed to the cellulose acetate with a low degree of substitution (WSCA-40-0.9). The measurement of total degree of acetyl substitution (DS), weight-average degree of polymerization (DPw), compositional distribution index (CDI), quantum yield, and relative emission intensity was performed in the same manner as in Example 1, and the measurement results are shown in Tables 2 and 3.

Example 8

(Cellulose Acetate)

Cellulose acetate with a low degree of substitution (WSCA-40-0.7) was obtained in the same manner as in Example 3 except that the reaction temperature was changed to 40° C., the time of first ripening, the time of second ripening, and the time of third ripening were changed to 8 hours, 16 hours, and 50 hours, respectively, and the precipitant was changed to methanol.

(Quantum Dot Composite)

Quantum dot composites were obtained in the same manner as in Example 1 except that the purified cellulose diacetate (Sigma-Aldrich-CTA-fraction) was changed to the cellulose acetate with a low degree of substitution (WSCA-40-0.7). The measurement of total degree of acetyl substitution (DS), weight-average degree of polymerization (DPw), compositional distribution index (CDI), quantum yield, and relative emission intensity was performed in the same manner as in Example 1, and the measurement results are shown in Tables 2 and 3.

Comparative Example 1

(Cellulose Acetate)

The cellulose acetate with a low degree of substitution (WSCA-40-0.9) and the cellulose acetate with a low degree of substitution (WSCA-40-0.7) were mixed in a ratio (weight ratio) of 1:1.

(Quantum Dot Composite)

Quantum dot composites were obtained in the same manner as in Example 1 except that the purified cellulose diacetate (Sigma-Aldrich-CTA-fraction) was changed to the mixture of the cellulose acetates with a low degree of substitution. The measurement of total degree of acetyl substitution (DS), weight-average degree of polymerization (DPw), compositional distribution index (CDI), quantum yield, and relative emission intensity was performed in the same manner as in Example 1, and the measurement results are shown in Tables 2 and 3.

Comparative Example 2

Quantum dot composites were obtained in the same manner as in Example 1 except that the purified cellulose diacetate (Sigma-Aldrich-CTA-fraction) was changed to polystyrene (Mw: 3,500), manufactured by Sigma-Aldrich). The measurement of total degree of acetyl substitution (DS), compositional distribution index (CDI), quantum yield, and relative emission intensity was performed in the same manner as in Example 1, and the weight-average degree of polymerization (DPw) of the polystyrene was determined by conversion from Mw. The measurement results are shown in Tables 2 and 3.

Comparative Example 3

Quantum dot composites were obtained in the same manner as in Example 1 except that the purified cellulose diacetate (Sigma-Aldrich-CTA-fraction) was changed to polymethyl methacrylate (Mw: 35,000, manufactured by Sigma-Aldrich). The measurement of total degree of acetyl substitution (DS), compositional distribution index (CDI), quantum yield, and relative emission intensity was performed in the same manner as in Example 1, and the weight-average degree of polymerization (DPw) of the polymethyl methacrylate was determined by conversion from Mw. The measurement results are shown in Tables 2 and 3.

INDUSTRIAL APPLICABILITY

The quantum dot composite according to the present invention can be used as a wavelength conversion element, a photoelectric conversion element, or a light-light conversion element, and solar cells (photoelectric conversion devices), light-emitting devices such as LEDs, light-receiving sensors operating in the infrared region etc., wavelength conversion elements, and light-light conversion devices using the quantum dot composite according to the present invention can achieve excellent conversion efficiency.

The invention claimed is:
1. A quantum dot composite comprising:
a matrix; and
quantum dots dispersed in the matrix, wherein
the matrix is composed of cellulose acetate whose compositional distribution index (CDI) represented by the following formula is 2.0 or less, and a concentration of the quantum dots is 0.05 wt % or higher:

$CDI = Z$ (measured value of half-width of compositional distribution)/$Z_0$ (theoretical value of half-width of compositional distribution), wherein
Z: half-width of compositional distribution of degree of acetyl substitution determined by HPLC analysis of cellulose acetate propionate obtained by propionylating all residual hydroxyl groups of the cellulose acetate, and $$Z_0 = 2.35482\sqrt{3 \cdot DPw \cdot p \cdot q}/DPw,$$

TABLE 2

| | Polymer | DS | DPw | CDI | Quantum yields (%) of quantum dot structures different in quantum dot fraction (wt %) | | | | |
| --- | --- | --- | --- | --- | --- | --- | --- | --- | --- |
| | | | | | 0.02 (wt %) | 1 (wt %) | 5 (wt %) | 10 (wt %) | 20 (wt %) |
| Example 1 | Sigma-Aldrich-CTA-fraction | 2.91 | 680 | 1.4 | 43 | 42 | 39 | 32 | 28 |
| Example 2 | CDA-fraction | 2.47 | 380 | 1.9 | 43 | 43 | 39 | 33 | 29 |
| Example 3 | WSCA-70-0.8 | 0.81 | 155 | 1.4 | 44 | 43 | 41 | 35 | 31 |
| Example 4 | Sigma-Aldrich-CTA | 2.90 | 690 | 2.3 | 45 | 41 | 25 | 23 | 14 |
| Example 5 | CDA | 2.50 | 380 | 2.6 | 45 | 42 | 26 | 22 | 16 |
| Example 6 | WSCA-40-0.8 | 0.79 | 144 | 2.1 | 45 | 41 | 25 | 24 | 15 |
| Example 7 | WSCA-40-0.9 | 0.87 | 170 | 2.4 | 43 | 40 | 26 | 21 | 15 |
| Example 8 | WSCA-40-0.7 | 0.70 | 117 | 2.6 | 44 | 40 | 22 | 22 | 14 |
| Comparative Example 1 | WSCA-40-0.9 + WSCA-40-0.7 | 0.79 | 144 | 3.5 | 44 | 39 | 14 | 5 | 4 |
| Comparative Example 2 | Sigma-Aldrich-PS | — | 340 | — | 39 | 38 | 34 | 18 | 9.5 |
| Comparative Example 3 | Sigma-Aldrich-PMMA | — | 500 | — | 38 | 31 | 29 | 16 | 6 |

TABLE 3

| | Relative emission intensities of quantum dot structures different in quantum dot fraction (wt %) | | | | |
| --- | --- | --- | --- | --- | --- |
| | 0.02 (wt %) | 1 (wt %) | 5 (wt %) | 10 (wt %) | 20 (wt %) |
| Example 1 | 0.0086 | 0.42 | 2.0 | 3.2 | 5.6 |
| Example 2 | 0.0086 | 0.43 | 2.0 | 3.3 | 5.8 |
| Example 3 | 0.0088 | 0.43 | 2.1 | 3.5 | 6.2 |
| Example 4 | 0.0090 | 0.41 | 1.3 | 2.3 | 2.8 |
| Example 5 | 0.0090 | 0.42 | 1.3 | 2.2 | 3.2 |
| Example 6 | 0.0090 | 0.41 | 1.3 | 2.4 | 3.0 |
| Example 7 | 0.0086 | 0.40 | 1.3 | 2.1 | 3.0 |
| Example 8 | 0.0088 | 0.40 | 1.1 | 2.2 | 2.8 |
| Comparative Example 1 | 0.0088 | 0.39 | 0.7 | 0.5 | 0.8 |
| Comparative Example 2 | 0.0078 | 0.38 | 1.7 | 1.8 | 1.9 |
| Comparative Example 3 | 0.0076 | 0.31 | 1.5 | 1.6 | 1.2 | wherein
- DPw: weight-average degree of polymerization (value determined by GPC-light scattering using cellulose acetate propionate obtained by propionylating all residual hydroxyl groups of the cellulose acetate),
- p: total degree of acetyl substitution of the cellulose acetate/3, and
- q: 1−p.

2. The quantum dot composite according to claim 1, wherein the concentration of the quantum dots is 10 wt % or higher.

3. The quantum dot composite according to claim 2, wherein the quantum dots are CdSe/ZnS quantum dots.

4. The quantum dot composite according to claim 2, which has a film shape.

5. A wavelength conversion element comprising the quantum dot composite according to claim 2.

6. A photoelectric conversion device comprising the quantum dot composite according to claim 2.

7. The quantum dot composite according to claim 1, wherein the quantum dots are CdSe/ZnS quantum dots.

8. The quantum dot composite according to claim 7, which has a film shape.

9. A wavelength conversion element comprising the quantum dot composite according to claim 7.

10. The quantum dot composite according to claim 1, which has a film shape.

11. A wavelength conversion element comprising the quantum dot composite according to claim 10.

12. A wavelength conversion element comprising the quantum dot composite according to claim 1.

13. A photoelectric conversion device comprising the quantum dot composite according to claim 1.

14. A solar cell comprising the quantum dot composite according to claim 1.

* * * * *